United States Patent [19]

Watanabe et al.

[11] 3,870,524

[45] Mar. 11, 1975

[54] PHOTOPOLYMERIZABLE COMPOSITION

[75] Inventors: Masaru Watanabe; Kesanao Kobayashi; Hiroshi Misu; Akira Sato, all of Kanagawa; Eiichi Hasegawa, Saitama, all of Japan

[73] Assignee: Fuji Photo Film Co., Ltd., Kanagawa, Japan

[22] Filed: Feb. 7, 1974

[21] Appl. No.: 440,426

[30] Foreign Application Priority Data

Feb. 7, 1973 Japan .............................. 48-14803

[52] U.S. Cl. ........ 96/115 P, 96/115 R, 204/159.18, 204/159.23, 204/159.24

[51] Int. Cl. .......................... G03c 1/68, G03c 1/04

[58] Field of Search ...................... 96/115 P, 115 R; 204/159.23, 159.24, 159.18

[56] References Cited

UNITED STATES PATENTS

| | | | |
|---|---|---|---|
| 2,870,011 | 1/1959 | Robertson et al. | 96/115 R |
| 3,574,622 | 4/1971 | Jenkins et al. | 96/115 P |
| 3,597,343 | 8/1971 | Delzenne et al. | 204/159.23 |

*Primary Examiner*—Norman G. Torchin
*Assistant Examiner*—Jack P. Brammer
*Attorney, Agent, or Firm*—Sughrue, Rothwell, Mion, Zinn & Macpeak

[57] ABSTRACT

A photopolymerizable composition comprising (A) a monomer having at least two terminal unsaturated groups which are photopolymerizable upon irradiation with actinic rays and (B) as a photopolymerization accelerator for the unsaturated monomer, a compound represented by the formula:

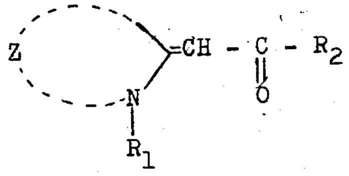

where Z represents a non-metallic atomic group necessary to form a heterocyclic nucleus containing a nitrogen atom; $R_1$ represents an alkyl group or a substituted alkyl group; and $R_2$ represents an alkyl group or an aryl group.

11 Claims, No Drawings

PHOTOPOLYMERIZABLE COMPOSITION

BACKGROUND OF THE INVENTION

1. Field of the Invention

The present invention relates to a photopolymerizable composition comprising an unsaturated monomer and a photopolymerization accelerator for the unsaturated monomer, and more particularly, to a photopolymerizable composition which can provide photohardenable images useful for making printing plates, photo resists and the like.

2. Description of the Prior Art

It is well known to reproduce images by photographic methods using a light-sensitive composition comprising an addition-polymerizable unsaturated monomer, a photopolymerization accelerator therefor and, if desired, a soluble polymer having an appropriate film-forming capability, a thermal-polymerization inhibitor, etc. That is, as described in U.S. Pat. No. 2,929,022 and 2,902,365, since the above-described light-sensitive composition becomes insoluble as the result of photopolymerization when it is irradiated with actinic rays, the desired photopolymerized images can be formed by forming an appropriate film of the light-sensitive composition, irradiating the film with actinic rays through a desired negative original and then removing the unexposed areas with an appropriate solvent. Needless to say, this type of light-sensitive composition is extremely useful as a light-sensitive material for making printing plates, photo resists, etc.

It has been proposed heretofore that a photopolymerization accelerator be added to the light-sensitive composition to enhance the sensitivity since the unsaturated monomer along is insufficient in sensitivity. Specific examples of such photopolymerization accelerators are benzylbenzoin, pivaloin, benzoin methyl ether, benzophenone, etc., the substituted compounds thereof, and polynuclear quinones such as anthraquinone, naphthoquinone or phenanthraquinone, and the substituted compounds thereof. However, these compounds do not provide sufficient sensitivity for practical purposes due to the fact that the wavelength of actinic rays necessary is in a comparatively short wavelength region and thus a long period of time is required to form images with light exposure.

As the result of various invenstigations, the inventors have found a series of compounds having a high accelerating effect for photopolymerization.

SUMMARY OF THE INVENTION

It is an object of the present invention to provide a photopolymerizable composition having high sensitivity. This and other objects are achieved by the photopolymerizable composition of this invention which comprises A. a monomer having at least two teminal unsaturated groups and capable of being photopolymerized upon irradiation with actinic rays and B. as a photopolymerization accelerator for the unsaturated monomer, a compound represented by the formula:

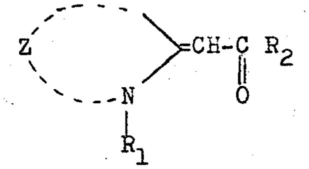

wherein $R_1$ represents an alkyl group which is conventionally known in cyanine dyes, such as a methyl group, an ethyl group, a propyl group, etc., or a substituted alkyl group such as a hydroxyalkyl group(e.g., a 2-hydroxyethyl group), an alkoxyalkyl group (e.g., a 2-methoxyethyl group), a carboxyalkyl group, (e.g., a carboxymethyl group, a 2-carboxyethyl group, a 3-carboxypropyl group) a sulfoalky group (e.g., a 2-sulfoethyl group, a 3-sulfopropyl group), a carboxyalkoxyalkyl group (e.g., a 2-carbomethoxyethyl group), an aralkyl group (e.g. a benzyl group, a phenethyl group), a sulfoaralkyl group (e.g., a p-sulfophenethyl group), a carboxy-aralkyl group (e.g., a p-carboxyphenethyl group), a vinylmethyl group, etc.; $R_2$ represents and alkyl group, such as a methyl group, and ethyl group, etc., or an aryl group, (e.g., a phenyl group, a naphtyl group) a hydroxyaryl group(e.g., a p-hydroxyphenyl group), an alkoxyaryl group(e.g., a p-methoxyphenyl group), a haloaryl group(e.g., a p-chlorophenyl group), a thienyl group, etc.; Z represents a non-metallic atomic group necessary for forming a nitrogen-containing heterocyclic nucleus which is generally used in cyanine dyes, e.g., a benzothiazole such as benzothiazole, 5-chlorobenzothiazole, 6-chlorobenzothiazole, 4-methylbenzothiazole, 6-methylbenzothiazole, 5-phenylbenzothiazole, 6-methoxybenzothiazole, 4-ethoxybenzothiazole, 5-methoxybenzothiazole, 5-hydroxy-benzothiazole, 5,6-dimethylbenzothiazole, 5,6-dimethoxybenzothiazole, etc., a naphthothiazole such as $\alpha$-naphthothiazole, $\beta$-naphthothiazole, a benzoselenazole such as benzoselenazole, 5- chlorobenzoselenazole, 6-methylbenzoselenazole, 6-methoxybenzoselenazole, etc., a naphthoselenazole such as $\alpha$-naphthoselenazole, $\beta$-naphthoselenazole, etc., a benzoxazole such as benzoxazole, 5-methylbenzoxazole, 5-phenylbenzoxazole, 6-methyoxybenzoxazole, etc., a naphthoxazole such as $\alpha$-naphthoxazole, $\beta$-naphthoxazole, etc.

DETAILED DESCRIPTION OF THE INVENTION

The unsaturated monomer used in this invention possesses at least two terminal unsaturated groups and is photopolymerizable upon irradiation with actinic rays. Examples of the monomer are described in U.S. Pat. Nos. 2,760,863; 2,791,504; 3,060,023; etc,. which include acrylates or methacrylates of polyols. Suitable polyols are those compounds having at least two aliphatic hydroxy groups, preferably having 2 to 5 aliphatic hydroxy groups and having from 2 to 12 carbon atoms. There are, for example, diols such as ethylene glycol, propylene glycol, diethylene glycol, triethylene glycol, 1,4-butane diol, 1,5-pentane diol, polycyclohexane oxide, polystyrene oxide, cyclohexane diol, xylylene diol, di-($\beta$-hydroxyethoxy)benzene; polyols such as glycerine, diglycerine, trimethylol propane, triethylolpropane, pentaerythritol, and the like. Specific examples are e.g., diethyleneglycol-diacrylate(dimethacrylate), triethyleneglycol-diacrylate-(dimethacrylate), pentaerythrithol-triacrylate(trimethacrylate), trimethylolpropane-triacrylate(trimethacrylate), etc., bis-acrylamides (bis-methacrylamides), e.g., methylenebis-acrylamide-(methacrylamide), ethylenebis-acrylamide(methacrylamide(, or unsaturated monomers containing urethane residues, e.g., the reaction products of diol monoacrylates(monomethacrylates)such as di-(2'-methacryloxyethyl)-2,4-tolylenediurethane, di-(2'-acryloxyethyl)trimethylene-diurethane, etc., with diisocyanates, or the like. Suitable diols for the diol monoacrylates are those diols as described in detail above. Suitable unsaturated monomers which can be used in this invention are described in detail in U.S. Pat. Nos. 2,760,863; 2,791,504; and 3,060,023.

Typical examples of the thiazoline derivatives which are a type of photopolymerization accelerator used in the present invention are set forth below. The number in pararences as set forth below references these compounds to Example 1 given hereinafter.

(II)

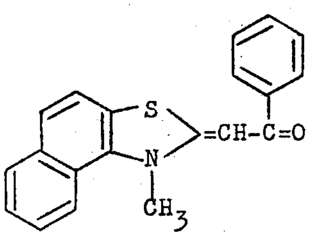

(III)

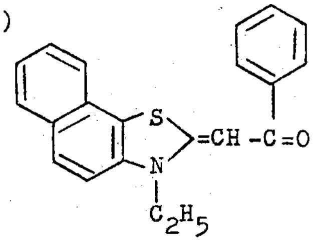

(IV)

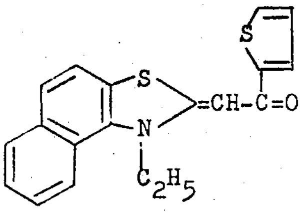

(V)

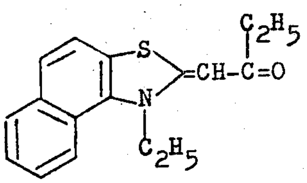

(VI)

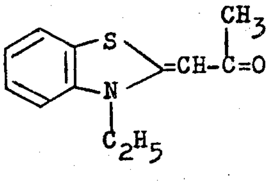

(VII)

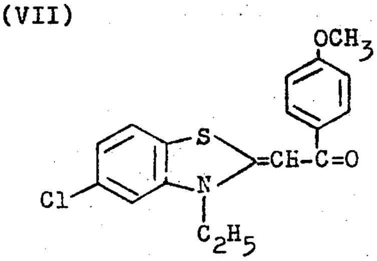

(VIII)

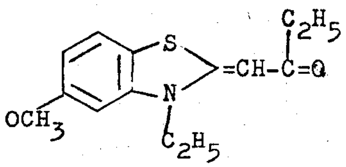

(IX)

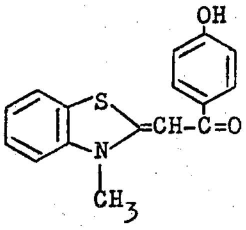

(X)

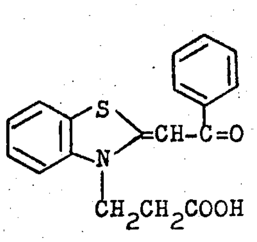

(XI)

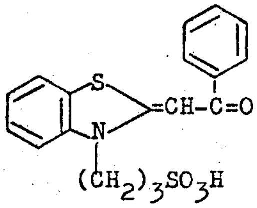

(XII)

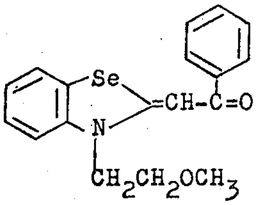

(XIII)

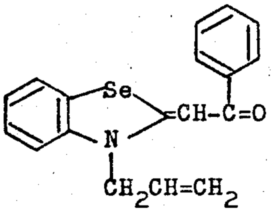

The thiazolone derivatives used in the present invention also include those which are already known as sensitizers for azide resins or cinnamic acid ester type light-sensitive resins as described in U.S. Pat. No. 2,948,610 and German OLS No. 2,012,390. The above fact, however, does not detract from the unexpectedness of this invention.

That is, there is a fundamental difference in mechanism between the sensitizers in those known techniques and the photopolymerization accelerator in this invention since the sensitizers for the azide resins or the cinnamic acid ester type light-sensitive resins simply act to cause an energy transfer while the compound of this invention acts to cause polymerization (as a photopolymerization initiator) by forming seeds for initiating the polymerization, and further a feature of this invention lies in the combination of the aforesaid photopolymerization accelerator and a monomer which has at least two terminal unsaturated groups and is photopolymerizable due to irradiation with actinic rays.

In general, the concentration of the photopolymerization accelerator to be used is low and a unduly high concentration causes undesired results such ash shielding from effective rays. The photopolymerization accelerator of the present invention can effectively be used in the range of 0.01 to 30 wt percent to the amount of the unsaturated monomer. More preferably, excellent results can be obtained when the photopolymerization accelerator is used in an amount of 1 to 10 wt percent to the amount of the unsaturated monomer.

In addition to the photopolymerization accelerator used in this invention, it is preferable to add an aromatic sulfonyl halide. Examples of suitable aromatic sulfonyl halides include, for example, benzene sulfonyl chloride, p-toluene sulfonyl chloride, 2-naphthalene sulfonyl chloride, 1-naphthalene sulfonyl chloride, benzene-1,3-disulfonyl chloride, p-chlorobenzene sulfonyl chloride, 4,4'-diphenyl-disulfonyl chloride, 4,4'-diphenyl ether disulfonyl chloride, 4,4'-diphenylthioether disulfonyl chloride, toluene-3,4-disulfonyl chloride, 2,7-naphthalene sulfonyl chloride, 4-phenoxybenzene sulfonyl chloride, and the like.

The aromatic sulfonyl halide can be used in an amount so that the total amount of the photopolymerization accelerator and the aromatic sulfonyl halide range from about 0.01 to 30 wt percent preferably 1 to 10 wt percent to the unsaturated monomer.

As described heretobefore, the composition of this invention can contain a soluble polymer. Specific examples of suitable soluble polymers which can be used include addition polymers having carboxy groups on the side chain thereof, e.g., acrylic acid/methyl methacrylate copolymer, styrene/acrylic acid copolymer, etc., cellulose derivatives similarly having carboxy groups on the side chains thereof; polyvinyl alcohol derivatives; soluble polyamides; polyurethanes; and the like. These soluble polymers can be incorporated in the composition in an optional amount, but an amount exceeding 90 wt percent undesirable from the standpoint of, e.g., the fastness of images formed. In accordance with the present invention, a small amount of a thermal polymerization inhibitor can be incorporated in the composition in order to prevent the occurrence of undesired thermal polymerization of the unsaturated monomer in the preparation of or during storage of light-sensitive composition. In most cases, improved storability can be expected due to the addition of thermal polymerization inhibitors. Suitable examples of thermal polymerization inhibitors include hydroquinone, p-methoxyphenol, di-tertbutyl-p-cresol, pyrogallol, tert-butylcatechol, methlene blue, etc. A generally used amount ranges from about 0.01 to 5 wt percent to the amount of the unsaturated monomer.

If desired, dyes or pigments can be added for the purpose of coloration.

The photopolymerizable composition of the present invention will now be described by reference to the following examples of the preferred embodiments of the invention. These examples are merely exemplary and are not in any way to be interpreted as limiting. Unless otherwise indicated all parts, percentages, ratios and the like are by weight.

EXAMPLE 1

In 153 parts by weight of methyl cellosolve were dissolved 4 parts by weight of hydrogen acetate phthalic acid cellulose ester, 12 parts by weight of di(2'-methacryloxyethyl)-2,4- tolylene diurethane, 0.2 part by weight of methylene blue and 0.8 part by weight of a photopolymerization accelerator shown in Table 1 below to produce a coating solution. After immersing an aluminum plate having a thickness of 0.3 mm in a sodium triphosphate solution of 70°C for 3 mins., the aluminum plate was thoroughly washed with water and dried. The coating solution and dried. The coating solution described above was coated onto the thus obtained aluminum plate using a revolving coating method. The aluminum plate was dried at 100°C for 2 mins.to obtain a light-sensitive plate. The coated amount was about 2.0 g/m$^2$ on a dry basis.

The light-sensitive plate was exposed through an LTF step wedge having a step density difference of 0.15 to a single phase carbon arc lamp of 30 A from a distance of 30 cm to print the step wedge thereon. Thereafter, the light-sensitive element was developed with a 3 percent sodium triphosphate solution. The results obtained are also shown in Table 1 below, where the step number which is rendered insoluble by photopolymerization conrresponds to the sensitivity. These results clearly demonstrate that the use of the accelerators (II – XIII) in accordance with the present invention give excellent sensitivity as compared to the case of adding no accelerator (I—I), or the case of using the prior art benzophenone (Accelerator I).

Table 1

| Sample No. | Structure of Photopolymerization Accelerator and No. thereof | Number of Step Developed |
|---|---|---|
| 1 - 1 | None | 1 |

Table 1 – Continued
| Sample No. | Structure of Photopolymerization Accelerator and No. thereof | Number of Step Developed |
|---|---|---|
| 1 - 2 | (I) 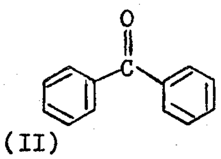 | 6 |
| 1 - 3 | (II) 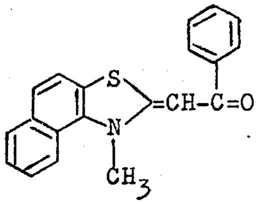 | 13 |
| 1 - 4 | (III) 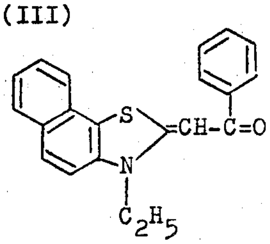 | 12 |
| 1 - 5 | (IV) 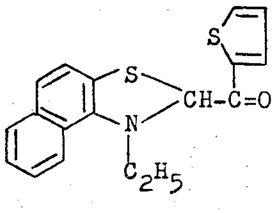 | 8 |
| 1 - 6 | (V) 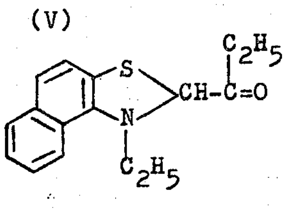 | 10 |
| 1 - 7 | (VI) 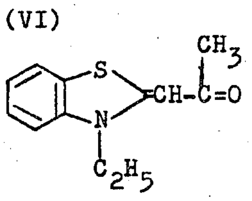 | 6 |
| 1 - 8 | (VII) 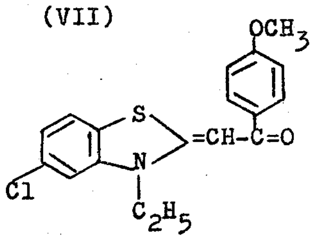 | 11 |

Table 1 – Continued
| Sample No. | Structure of Photopolymerization Accelerator and No. thereof | Number of Step Developed |
|---|---|---|
| 1 - 9 | (VIII) 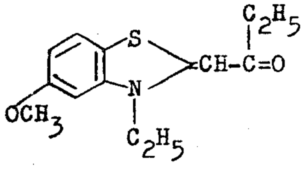 | 8 |
| 1 - 10 | (IX) 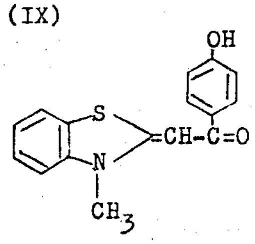 | 10 |
| 1 - 11 | (X) 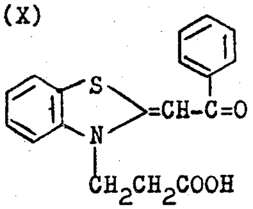 | 12 |
| 1 - 12 | (XI) 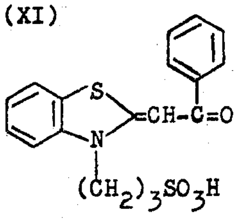 | 11 |
| 1 - 13 | (XII) 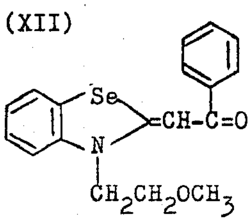 | 12 |
| 1 - 14 | (XIII) 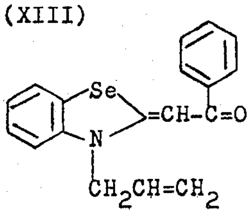 | 10 |

EXAMPLE 2

A light-sensitive plate was produced in a similar manner to Example 1 in accordance with the formulation shown below.

| | parts by weight |
|---|---|
| Methyl Methacrylate/Methacrylic Acid Copolymer | 30 |
| Trimethylolpropane Triacrylate | 15 |
| Photopolymerization Accelerator* | 0.75 |
| Methyl Ethyl Ketone | 60 |

* as shown in Table 2 below

The thus produced light-sensitive plate was expsoed through an LTF step wedge having a step density difference of 0.15 with a chemical lamp exposure apparatus of 100 V and 20 W for 3 mins. Then, the light-sensitive plate was developed with a developer consisting of 1.2 g of sodium hydroxide, 300 cc of isopropyl alcohol and 900 cc of water to remove the unexposed areas. The number of the step photohardened after development is shonw in Table 2 below. In particular, it can clearly be seen from the results in Table 2 that 2-benzoylmethylene-3-ethylnaphthothiazoline has an extremely excellent photopolymerization accelerating effect.

Table 2

| Sample No. | Photopolymerization Accelerator | Number of Developed Step |
|---|---|---|
| 2-1 | Compound III of Table 1 (2-Benzoylmethylene-3-ethylnaphthothiazoline) | 7 |
| 2-2 | Michler's Ketone | 2.5 |
| 2-3 | Phenanthraquinone | 4.5 |
| 2-4 | tert-Butylanthraquinone | 3.5 |
| 2-5 | Benzoin Methyl Ether | 0 |

A similar light-sensitive plate was exposed through a dot nagative instead of the step wedge and developed to produce a lithographic printing plate. Upon use of the printing plate, printing was conducted with an offset printing machine in a conventional manner. In using the printing plate obtained from Sample 2-1, more than 50,000 satisfactory copies were obtained. On the contrary, in using the printing plates obtained from Sample 2-2 and Sample 2-4, respectively, the printed images became unclear in printing between 10,000 – 20,000 copies and the printing of more than 20,000 copies was impossible. From Sample 2-5 no printing plate which could be used for printing could be obtained.

From the above results, it can be seen that in using Compound III of this invention, not only can high sensitivity be obtained but also the printability is superior.

EXAMPLE 3

A light-sensitive liquid having the following composition was prepared.

| | parts by weight |
|---|---|
| Polymethyl Methacrylate (Toray Industries, Inc.) | 20 |
| Trimethyololpropane Trimethacrylate | 5 |
| Dioctyl Phthalate | 2 |
| Photopolymerization Accelerator (Compound III of Table 1) | 0.4 |
| Methylene Blue | 0.6 |
| Methyl Ethyl Ketone | 70 |
| Dimethylsulfoxide | 30 |

The obtained liquid was coated onto a polyethylene terephthalate film having a thickness of 25 μ using a coating rod so as to have a dry thickness of 20 μ. Separately, a copper-coated laminate plate for printed wire use was dewaxed, abraded and washed with nitric acid and then dried. The light-sensitive element obtained above was laminated onto the surface of the copper-coated laminate plate treated as described above, which was then heated to 140°C and then pressed and adhered together. After stripping of the polyethylene terephthalate film, the remaining plate was exposed for 5 mins. with a high pressure mercury lamp of 400 W at a distance of 30 cm through a negative original for a print wire and then developed with trichloroethylene, whereby the unexposed areas were dissolved and removed. As the result, blue resist images which correspond to the negative original were formed on the copper plate. The copper plate was then etched with a ferric chloride solution (40° Baume). After washing with water, the light-sensitive layer was removed with methylene chloride to give the desired clear print wire plate.

EXAMPLE 4

A light-sensitive liquid was prepared except that Compound V was employed as a photopolymerization accelerator instead of Compound III in the composition of Example 3. The thus obtained light-sensitive liquid was spray coated onto a zinc plate for a relief printing and dried. The zinc plate was exposed using a carbon arc lamp in intimate contact with a dot negative and then developed using trichloroethylene. The plate was etched with nitric acid to give the desired printing plate for a relief printing.

EXAMPLE 5

(A) 100 g of hydroxypropylmethylacetylcellulose hexahydrophthalate (HPMA CHP) [degree of substitution: hydroxypropyl group: methyl group: acetyl group = 0.18 : 1.35 : 1.43; degree of hexahydrophthalyl group substitution: 0.85; viscosity, 93.2 cps (acetone/methanol = 7/3 by volume mixed solvent, 20°C], 20 g of glycidylmethacrylate 6.4 g of triethylamine, 0.024 g of hydroquinone and 200 g of acetone as a solvent were mixed together, and were reacted for a week at 50°C. After the reaction the mixture was diluted with methanol and the polymer was precipitated by pouring the solution into an excessive amount of water. The polymer was dried with hot air at 40°C after filtration to obtain glycidyl methacrylate denaturated acidic cellulose derivative (GMA-HPMACHP). Using a weak-alkali soluble linear organic high molecular weight polymer having pendant carboxy groups and a methacrylate groups as a film forming agent, the following light sensitive solution was prepared.

| Component | Amount |
|---|---|
| GMA-HPMACHP | 0.3 g |
| Di-(2'-acryloxyethyl)-2,4-toluenedi- | 0.7 g |
| 2-Naphthalenesulfonyl Chloride | 0 – 0.06 g |
| 3-Methyl-2-benzoylmethylenenaphtho-[1,2-α]-thiazole | 0 – 0.08 g |
| Methylcellosolveacetate | 14 g |

The light-sensitive solution was coated on a silicate treated aluminum support after graining with a nylon brush using a No. 12 coating rod. After drying for 2 min. at 100°C, the element was exposed for 20 sec. to an LTF successive step wedge having a step density difference of 0.15 using a chemical lamp (made by Matsushita Co., FL-20 BA-37 100 V, 20 W). The exposed element was developed with a developing solution of 10 g of triethanolamine, 30 g of butylcellosolve, 950 g of water. The sensitivity (development step number) under the condition which the amount of 2-naphthalenesulfonylchloride as an aromatic sulfonyl halide was changed from 0 to 6 wt percent (0 g to 0.06 g) and the amount of 3-methyl-2-benzoylmethylenenaphtho-[1,2-α] was changed from 0 to 8 wt percent (0 g to 0.08 g) is shown in Table 1.

Table 3

Sensitivity of 2-Naphthalenesulfonylchloride and 3-Methyl-2-benzoylmethylenenaphtho[1,2-α]-thiazole as a Mixed Photopolymerization Initiator

| 2-Naphthalene-sulfonylchloride | 3-Methyl-2-benzoyl-methylenenaphtho-[1,2-α]thiazole | Development Step Number |
|---|---|---|
| (g) | (g) | |
| 0 | 0.02 | 4 |
| 0.01 | 0.02 | 10 |
| 0.02 | 0.02 | 14 |
| 0.04 | 0.02 | 14 |
| 0.06 | 0.02 | 12 |
| 0.02 | 0 | 0 |
| 0.01 | 0.01 | 12 |

Table 3 – Continued

| 2-Naphthalene-sulfonylchloride | 3-Methyl-2-benzoyl-methylenenaphtho-[1,2-α]thiazole | Development Step Number |
|---|---|---|
| 0.02 | 0.02 | 14 |
| 0.03 | 0.03 | 15 |
| 0.04 | 0.04 | 13 |

As is apparent from the above results, the sensitivity is very low when only 2-naphthalenesulfonylchloride or 3-methyl-2-benzoylmethylenenaphtho[1,2-α]thiazole was used, but the sensitivity is increased by combining these accelerators.

EXAMPLE 6

The sensitivity (development step number) was obtained under the same conditions except that the thiazole derivatives of Table 4 were used instead of the 3-methyl-2-benzoylmethylenenaphtho[1,2-α]thiazole as a photopolymerization accelerator of Example 5. 2 Weight percent (0.02 g) of 2-naphthalenesulfonylchloride was used in combination therewith.

Table 4

Sensitivity of 2-Naphthalenesulfonylchloride (2 wt%) and a Thiazole Derivative Mixed Photopolymerization initiator

| Thiazole Derivative | Development Step No. | Thiazole Derivative | Development Step No. |
|---|---|---|---|
| 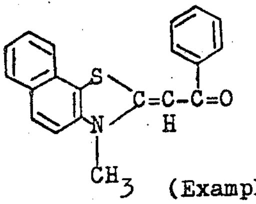 (Example5 ) | 14 | 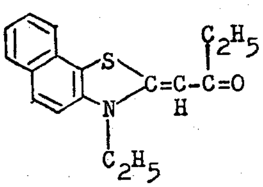 | 6 |
| 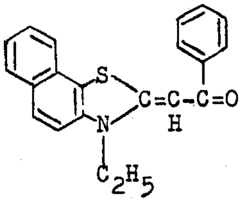 | 13 | 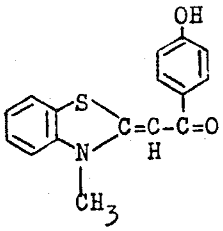 | 8 |
| 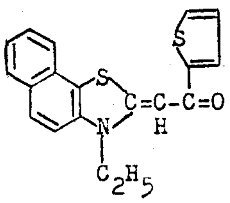 | 11 | 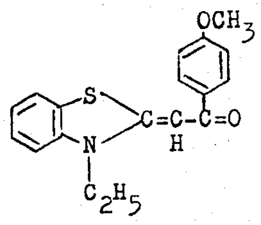 | 7 |

EXAMPLE 7

The sensitivity (development step number) was obtained under the same conditions except that various aromatic sulfonyl-chlorides were used instead of the 2-naphthalenesulfonylchloride as the photopolymerization initiator of Example 5. 0.02 g of 3-methyl-2-benzoylmethylenenaphtho[1,2-α]thiazole was used.

Table 5

| Aromatic Sulfonyl Chloride | Sensitivity |
|---|---|
| 2 wt% (0.02 g) | (development step No.) |
| 2-Naphthalenesulfonylchloride (Example 5) | 14 |
| p-Toluenesulfonylchloride | 12 |
| Toluene-3,4-disulfonylchloride | 14 |

EXAMPLE 8

After 65 g of methacrylic acid/methylmethacrylate copolymer (15:85 weight ratio), 0.27 g of trimethylolpropanetriacrylate, 0.08 g of dioctylphthalate, 0.02 g of 3-methyl-2-benzoylmethylenenaphtho[1,2-α]thiazole, 0.02 g of 2-naphthalenesulfonylchloride, 0.001 g of p-methoxyphenol, were dissolved in 14 g of a mixed solution of dichloroethylene/methyl ethyl ketone (1:1 by volume), the solution was coated on a silicate treated aluminum plate as described in Example 5 using a No. 12 coating rod, and dried for 2 min. at 100°C. The element was exposed to an LTF successive step wedge(-difference = 0.15) for 60 sec. using a chemical lamp (Matsushita Co., FL-30BA-37, 100 V, 20 W), then treated with the same development solution as described in Example 5. A sensitivity of 8 (development step no.) was obtained. This is a very high sensitivity for a lithographic PS (PreSensitized Printing) Plate.

While the invention has now been described in detail and with reference to specific embodiments thereof, it will be apparent to one skilled in the art that various changes and modifications can be made therein without departing from the spirit and scope thereof.

What is claimed is:

1. A photopolymerizable composition comprising (A) a monomer containing at least two terminal unsaturated groups and photopolymerizable upon irradiation of actinic rays and (B) as a photopolymerization accelerator for said photopolymerizable monomer, a compound represented by the formula:

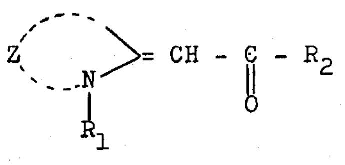

where Z represents a non-metallic atomic group necessary forming a nitrogen-containing heterocyclic nucleus; $R_1$ represents an alkyl group; and $R_2$ represents an alkyl group or an aryl group.

2. The photopolymerizable composition of claim 1, wherein the non-metallic atomic group formed by Z is a benzothiazole ring, a naphthothiazole ring, a naphthoselenazole ring, a benzoxazole ring or a naphthoxazole ring; $R_1$ represents an alkyl group, a hydroxyalkyl group, an alkoxyalkyl group, a carboxyalkyl group, a sulfoalkyl group, a carboalkoxyalkyl group, an aralkyl group, a sulfoaralkyl group, a carboxyaralkyl group, or a vinylmethyl group; and $R_2$ represents an alkyl group, an aryl group, a hydroxyaryl group, an alkoxyaryl group, a haloaryl group, or a thienyl group.

3. The photopolymerizable composition of claim 1, wherein said monomer is an acrylic acid ester of a polyol or a methacrylic acid ester of a polyol, an acrylamide, or a reaction product of a diol monoacrylate or monomethacrylate and a diisocyanate.

4. The photopolymerizable composition of claim 1, wherein said photopolymerization accelerator is present in an amount of 0.01 to 30 percent by weight to the weight of said unsaturated monomer.

5. The photopolymerizable composition of claim 4, wherein said photopolymerization accelerator is present in an amount of 1 to 10 percent by weight.

6. The photopolymerizable composition of claim 1, including a soluble polymer in said photopolymerizable composition.

7. The photopolymerizable composition of claim 6, wherein said soluble polymer is an acrylic acid methyl methacrylate copolymer, a styrene/acrylic acid copolymer, a cellulose derivative having pendant carboxy groups, a polyvinyl alcohol derivative, a soluble polyamide or a polyurethane.

8. The photopolymerizable composition of claim 1, including at least one aromatic sulfonyl halide in said composition.

9. The photopolymerizable compositon of claim 8, wherein said aromatic sulfonyl halide is benzene sulfonyl chloride, p-toluene sulfonyl chloride, 2-naphthalene sulfonyl chloride, 1-naphthalene sulfonyl chloride, benzene-1,3-disulfonyl chloride, p-chlorobenzene sufonyl chloride, 4,4'-diphenyldisulfonyl chloride, 4,4'-diphenylether disulfonyl chloride, 4,4'-diphenylthioether disulfonyl chloride, toluene-3,4-disulfonyl chloride, 2,7-naphthalene sulfonyl chloride or 4-phenoxybenzene sulfonyl chloride.

10. The photopolymerizable composition of claim 8, wherein said photopolymerizable accelerator and said aromatic sulfonyl halide are present in an amount of 0.01 to 30 percent by weight to said unsaturated monomer.

11. The photopolymerizable composition of claim 10, wherein said photopolymerization accelerator and said aromatic sulfonyl halide are present in an amount of 1 to 10 percent by weight.

* * * * *